United States Patent
Li et al.

(10) Patent No.: US 8,920,031 B2
(45) Date of Patent: Dec. 30, 2014

(54) SPLIT TYPE AEROSTATIC BEARING

(75) Inventors: Jinchun Li, Shanghai (CN); Jie Fang, Shanghai (CN); Yeqin Zheng, Shanghai (CN); Hai Xia, Shanghai (CN); Liwei Wu, Shanghai (CN)

(73) Assignee: Shanghai Micro Electronics Equipment Co., Ltd., Shanghai (CN)

( * ) Notice: Subject to any disclaimer, the term of this patent is extended or adjusted under 35 U.S.C. 154(b) by 0 days.

(21) Appl. No.: 14/002,561

(22) PCT Filed: Feb. 13, 2012

(86) PCT No.: PCT/CN2012/071057
§ 371 (c)(1),
(2), (4) Date: Aug. 30, 2013

(87) PCT Pub. No.: WO2012/119502
PCT Pub. Date: Sep. 13, 2012

(65) Prior Publication Data
US 2014/0016886 A1    Jan. 16, 2014

(30) Foreign Application Priority Data

Mar. 7, 2011 (CN) .......................... 2011 1 0053278

(51) Int. Cl.
*F16C 32/06* (2006.01)
*F16C 29/02* (2006.01)

(52) U.S. Cl.
CPC .......... *F16C 32/0614* (2013.01); *F16C 29/025* (2013.01); *F16C 32/0674* (2013.01); *F16C 2370/00* (2013.01)
USPC .......................................................... 384/12

(58) Field of Classification Search
USPC .......................................................... 384/12
See application file for complete search history.

(56) References Cited

U.S. PATENT DOCUMENTS

| 5,129,733 | A  | * | 7/1992 | Enderle et al. ................... 384/10 |
| 5,199,796 | A  | * | 4/1993 | Enderle et al. ................ 384/100 |
| 5,967,666 | A  | * | 10/1999 | Johnson ......................... 384/12 |
| 6,402,380 | B1 | * | 6/2002 | Sogard ........................... 384/12 |
| 7,255,478 | B2 | * | 8/2007 | Ahn et al. ....................... 384/12 |
| 7,946,767 | B2 | * | 5/2011 | Nakajima et al. ............... 384/12 |
| 8,529,130 | B2 | * | 9/2013 | Schubert et al. .................. 384/9 |
| 2005/0008269 | A1 | * | 1/2005 | Akutsu et al. ................... 384/12 |
| 2007/0014494 | A1 |   | 1/2007 | Wardman et al. |

(Continued)

FOREIGN PATENT DOCUMENTS

| CN | 2480870 Y | 3/2002 |
| CN | 1858653 A | 11/2006 |

(Continued)

*Primary Examiner* — Thomas R. Hannon
(74) *Attorney, Agent, or Firm* — Muncy, Geissler, Olds & Lowe, P.C.

(57) ABSTRACT

A split-type aerostatic bearing for supporting a moving table to move frictionlessly on a platform (4) is disclosed. The split-type aerostatic bearing includes an aerostatic bearing plate (6), air floating elements (2'a, 2'b, 2'c, 2'd) disposed on a bottom of the aerostatic bearing plate (6) and a vacuum pre-tightening structure (7) disposed on the aerostatic bearing plate (6). The vacuum pre-tightening structure (7) is coupled to the aerostatic bearing plate (6) in a split fashion. Separation of the air floating elements (2'a, 2'b, 2'c, 2'd) from the vacuum pre-tightening structure (7) prevents the aerostatic bearing plate (6) from bending under a vacuum pre-tightening force, and hence will not affect the air floating area.

10 Claims, 4 Drawing Sheets

(56) References Cited

U.S. PATENT DOCUMENTS

| | | | |
|---|---|---|---|
| 2007/0279804 A1 | 12/2007 | White | |
| 2008/0304772 A1* | 12/2008 | Kakutani et al. | 384/12 |
| 2010/0092113 A1* | 4/2010 | Muneishi | 384/12 |
| 2010/0141923 A1 | 6/2010 | Motomura et al. | |

FOREIGN PATENT DOCUMENTS

| | | |
|---|---|---|
| CN | 101290808 A | 10/2008 |
| CN | 101303532 A | 11/2008 |
| CN | 101344123 A | 1/2009 |
| CN | 10153326 A | 9/2009 |
| CN | 101702404 A | 5/2010 |
| JP | 2003-231117 A | 11/2003 |
| JP | 2003-321117 A | 11/2003 |
| JP | 2004-152941 A | 5/2004 |
| JP | 2004-331265 A | 11/2004 |
| JP | 2007-24314 A | 2/2007 |
| JP | 2009-19688 A | 1/2009 |

\* cited by examiner

SPLIT TYPE AEROSTATIC BEARING

TECHNICAL FIELD

The present invention relates to microelectronic equipment, and more particularly, to a split-type aerostatic bearing.

BACKGROUND

An aerostatic bearing is a key component of a precision moving table, which provides the moving table with gas bearing support and thereby enables a friction-free movement thereof on a platform (which is generally a marble platform). Typically, an aerostatic bearing includes air floating elements and a vacuum pre-tightening structure.

FIG. 1 shows a square aerostatic bearing of the prior art, in which air floating elements 2a, 2b, 2c, 2d are disposed respectively at four corners of a bottom of an aerostatic bearing plate 1 and a vacuum pre-tightening structure 3 is disposed at a center portion of the aerostatic bearing plate 1. Both the air floating elements 2a, 2b, 2c, 2d and the vacuum pre-tightening structure 3 are formed integrally from the aerostatic bearing plate 1.

As shown in FIG. 2, during the operation of the square aerostatic bearing, positive pressure gas is introduced into the air floating elements 2a, 2b, 2c, 2d to form a gas membrane between the aerostatic bearing and the platform 4, thereby enabling the aerostatic bearing to be supported by an aerostatic force N and thus enabling the aerostatic bearing to move frictionlessly on the platform 4. Meanwhile, negative pressure gas is introduced into the vacuum pre-tightening structure 3 to generate a vacuum pre-tightening force F operated on the aerostatic bearing in an opposite direction to the aerostatic force N. Adjusting the aerostatic force N and the vacuum pre-tightening force F can change the aerostatic stiffness of the aerostatic bearing.

Above described is an integral-type aerostatic bearing whose air floating elements and vacuum pre-tightening structure are integrally formed from a single aerostatic bearing plate. Such aerostatic bearing is characterized in that the increase of its aerostatic stiffness requires the increase of both the aerostatic force N and the vacuum pre-tightening force F at the same time. However, the increase of the vacuum pre-tightening force F will lead to a bending of a central portion of the aerostatic bearing plate 1 (as shown by the dotted lines in FIG. 2). As the thickness δ of the gas membrane is generally only several micrometers to a dozen or more micrometers, when the bending amount σ of the aerostatic bearing plate 1 is large, the central portion of the aerostatic bearing plate 1 may contact with the platform 4, and hence generate mechanical friction which can disable the floating effect of the aerostatic bearing.

SUMMARY OF THE INVENTION

The present invention is directed to the provision of a split-type aerostatic bearing including air floating elements and a vacuum pre-tightening structure which are separated from each other, thereby preventing the aerostatic bearing plate from bending under a vacuum pre-tightening force, and hence will not affect the floating effect.

To this end, the present provides a split-type aerostatic bearing for supporting a moving table to move frictionlessly on a platform. The split-type aerostatic bearing includes an aerostatic bearing plate; air floating elements disposed on a bottom of the aerostatic bearing plate; and a vacuum pre-tightening structure disposed on the aerostatic bearing plate, wherein the vacuum pre-tightening structure is coupled to the aerostatic bearing plate in a split type.

In the split-type aerostatic bearing, each coupling point between the vacuum pre-tightening structure and the aerostatic bearing plate may be aligned on a same normal line of the platform with a center of a corresponding one of the air floating elements.

In the split-type aerostatic bearing, a bottom surface of the vacuum pre-tightening structure may be at a higher level than a bottom surface of the aerostatic bearing plate.

In the split-type aerostatic bearing, the vacuum pre-tightening structure may include a vacuum plate and a vacuum plate fixing frame, wherein the vacuum plate is disposed on a bottom of the vacuum plate fixing frame, wherein the vacuum plate fixing frame is coupled to the aerostatic bearing plate, and wherein a vacuum chamber is formed between the vacuum plate and the aerostatic bearing plate.

In the split-type aerostatic bearing, a sealing ring for sealing the vacuum chamber may be disposed between the vacuum plate and the aerostatic bearing plate.

In the split-type aerostatic bearing, the frame may be coupled to the vacuum plate by support adjusting screws which adjust a distance between the vacuum plate and the aerostatic bearing plate and thereby drive the vacuum plate to squeeze the sealing ring.

In the split-type aerostatic bearing, the vacuum pre-tightening structure may further include a capping plate disposed on a top of the vacuum plate fixing frame.

In the split-type aerostatic bearing, flexible reeds for horizontally positioning the vacuum pre-tightening structure may be disposed at edges of the vacuum pre-tightening structure.

In the split-type aerostatic bearing, each of the flexible reed may include a body, a first vertical reed and a second vertical reed; the first vertical reed and the second vertical reed are arranged on a same side of the body; the first vertical reed has one end coupled to the body and the other end coupled to one end of the second vertical reed; the body is coupled to the aerostatic bearing plate; and both the first vertical reed and the second vertical reed are coupled to the vacuum pre-tightening structure.

In the split-type aerostatic bearing, each of the air floating elements may be disposed at a corresponding one of four corners of the bottom of the aerostatic bearing plate.

In the split-type aerostatic bearing, all the four corners of the vacuum pre-tightening structure may be coupled to the aerostatic bearing plate, and a coupling point between each corner and the aerostatic bearing plate is aligned on a same normal line of the platform with a center of a corresponding one of the air floating elements.

Separation of the air floating elements from the vacuum pre-tightening structure and alignment of each coupling point between the vacuum pre-tightening structure and the aerostatic bearing plate on a same normal line of the platform with the center of the corresponding air floating element can position the corresponding application point of a vacuum pre-tightening force also onto the normal line of the platform. This prevents the plate from bending out of shape and thus prevents it affecting the normal operation of the aerostatic bearing.

Moreover, the split-type aerostatic bearing meets the demand for a high aerostatic stiffness.

BRIEF DESCRIPTION OF THE DRAWINGS

The split-type aerostatic bearing of the present invention will be further specified and described with reference to the following exemplary embodiments and accompanying drawings.

DETAILED DESCRIPTION OF THE INVENTION

Specific description of a split-type aerostatic bearing embodying the present invention will be provided below with reference to FIGS. 3 to 7.

The split-type aerostatic bearing includes an aerostatic bearing plate, air floating elements disposed on a bottom of the aerostatic bearing plate and a vacuum pre-tightening structure disposed on the aerostatic bearing plate. The vacuum pre-tightening structure is coupled to the aerostatic bearing plate in a split fashion. Each coupling point of the vacuum pre-tightening structure and the aerostatic bearing plate may be aligned on a same normal line of the platform with a center of a corresponding one of the air floating elements. A bottom surface of the vacuum pre-tightening structure may be configured at a higher level than a bottom surface of the aerostatic bearing plate. A vacuum chamber may be formed between the bottom surface of the vacuum pre-tightening structure and the bottom surface of the aerostatic bearing plate.

In the split-type aerostatic bearing embodying the present invention, the air floating elements are separated from the vacuum pre-tightening structure and each coupling point between the vacuum pre-tightening structure and the aerostatic bearing plate is aligned on a same normal line of the platform with the center of the corresponding air floating element, therefore, the corresponding application point of a vacuum pre-tightening force to the aerostatic bearing plate is also aligned on the same normal line of the platform with the center of the corresponding air floating element. This prevents the aerostatic bearing plate from bending out of shape and thus will not affect the normal operation of the aerostatic bearing.

A split-type aerostatic bearing embodying the present invention will now be described in detail below with reference to a specific embodiment.

In the embodiment, the split-type aerostatic bearing is a key component of a precision moving table. It can provide the moving table with gas bearing support and thereby can enable the moving table to make friction-free movement on a platform (which is generally a marble platform).

Figure 1:
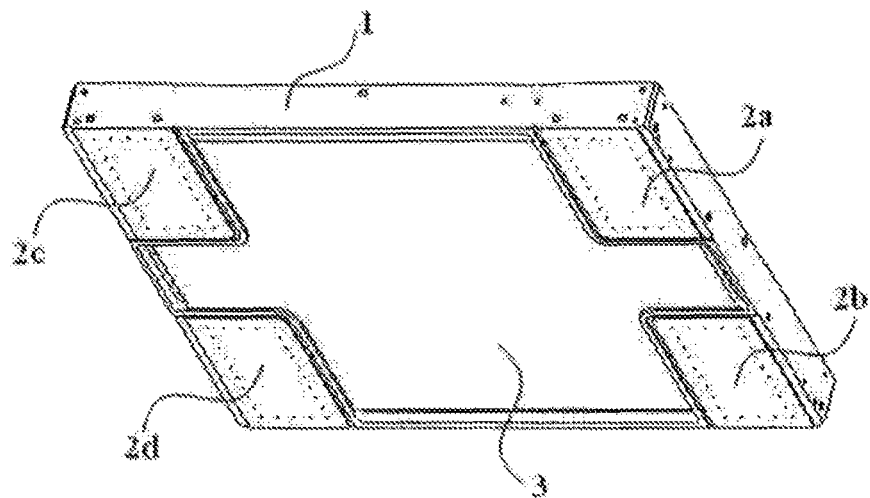
FIG. 1 shows a schematic illustration of an aerostatic bearing of the prior art.
Figure 2:
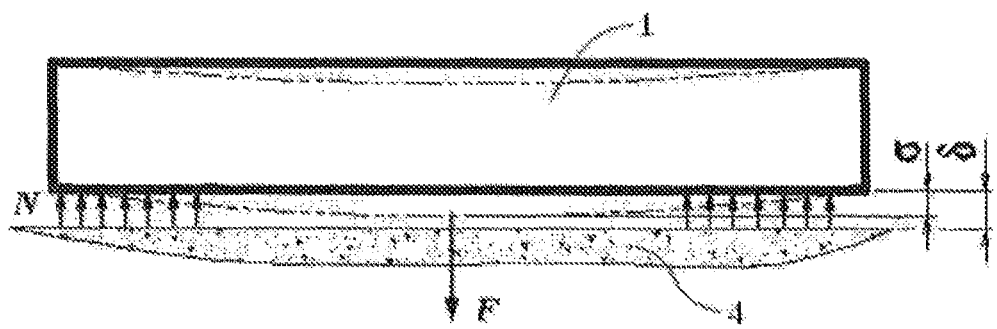
FIG. 2 illustrates the operating mechanism of the aerostatic bearing of the prior art.
Figure 3:
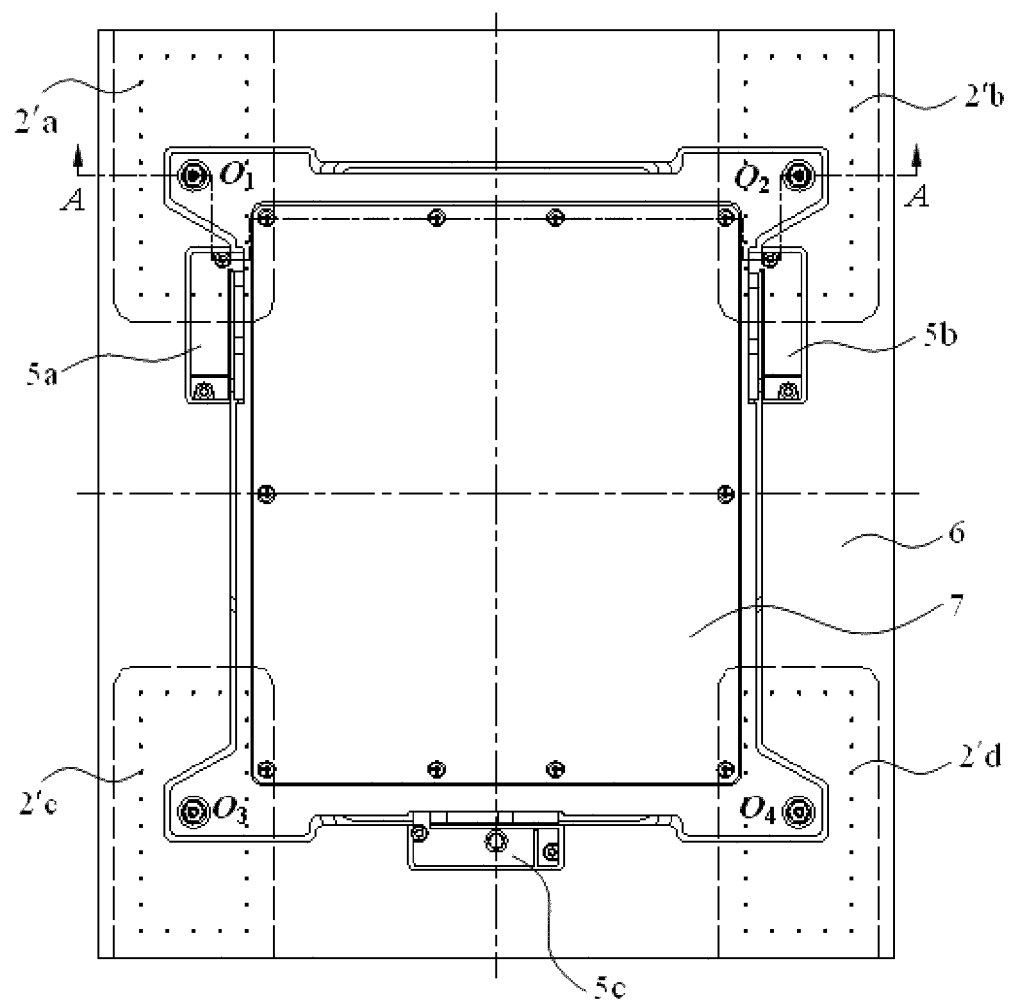
FIG. 3 depicts a top view of an aerostatic bearing embodying the present invention.
Figure 4:
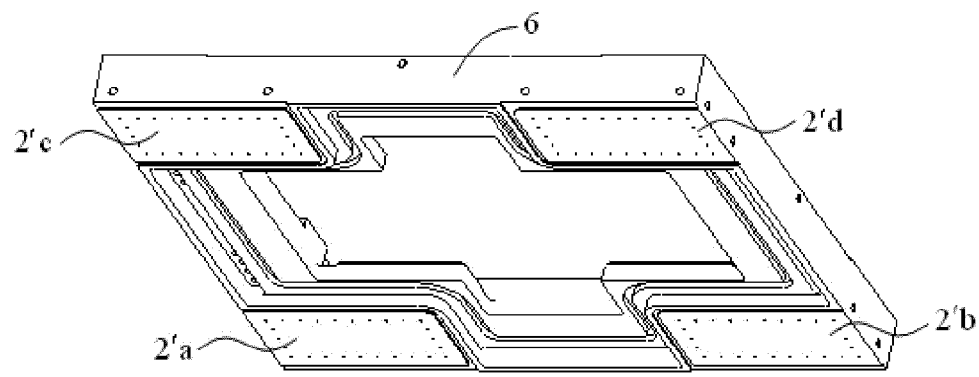
FIG. 4 depicts a bottom of the aerostatic bearing embodying the present invention.

Turning now to FIGS. 3 to 4, the split-type aerostatic bearing includes an aerostatic bearing plate 6. Air floating elements 2'a, 2'b, 2'c, 2'd are disposed on the four corners of a bottom of the aerostatic bearing plate 6, respectively. Moreover, a vacuum pre-tightening structure 7 is also disposed on the aerostatic bearing plate 6.

The air floating elements 2'a, 2'b, 2'c, 2'd may be formed by shaping the aerostatic bearing plate 6. That is, the air floating elements 2'a, 2'b, 2'c, 2'd may be formed integrally with the aerostatic bearing plate 6.

The vacuum pre-tightening structure 7 is disposed on the aerostatic bearing plate 6 and coupled to the aerostatic bearing plate 6 in a split fashion.

Figure 5:
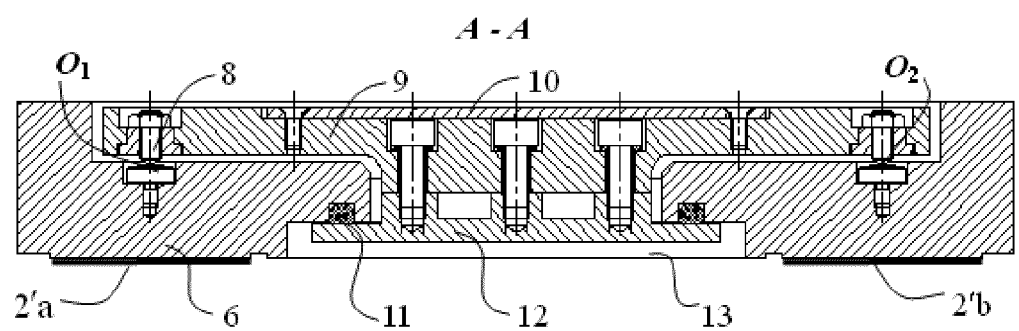
FIG. 5 depicts a sectional view taken along the line A-A of FIG. 3.

Referring to FIG. 5, the vacuum pre-tightening structure 7 may include a vacuum plate 12, a vacuum plate fixing frame 9, and a capping plate 10.

The vacuum plate 12 is disposed on a bottom of the vacuum plate fixing frame 9.

The vacuum plate fixing frame 9 may be coupled to the aerostatic bearing plate 6 by support adjusting screws 8.

The capping plate 10 is disposed on a top of the vacuum plate fixing frame 9.

A bottom surface of the vacuum plate 12 may be configured at a higher level than a bottom surface of the aerostatic bearing plate 6, thereby forming a vacuum chamber 13 between the vacuum plate 12 and the aerostatic bearing plate 6.

With continuing reference to FIG. 5, the vacuum plate 12 is fixed on a bottom of the vacuum plate fixing frame 9 and the capping plate 10 is fixed on a top of the vacuum plate fixing frame 9 by screws, respectively.

A central part of an upper portion of the aerostatic bearing plate 6 may define a ladder-like hollow and the vacuum pre-tightening structure 7 is disposed in the hollow.

A rubber sealing ring 11 may be disposed between the vacuum plate 12 and the aerostatic bearing plate 6 to seal the vacuum chamber 13 formed between them.

In conjunction reference to FIG. 3, the vacuum plate fixing frame 9 may be coupled to the aerostatic bearing plate 6 in a manner that each of the four corners of the vacuum plate fixing frame is connected to the aerostatic bearing plate with one of the support adjusting screws 8.

Figure 7:
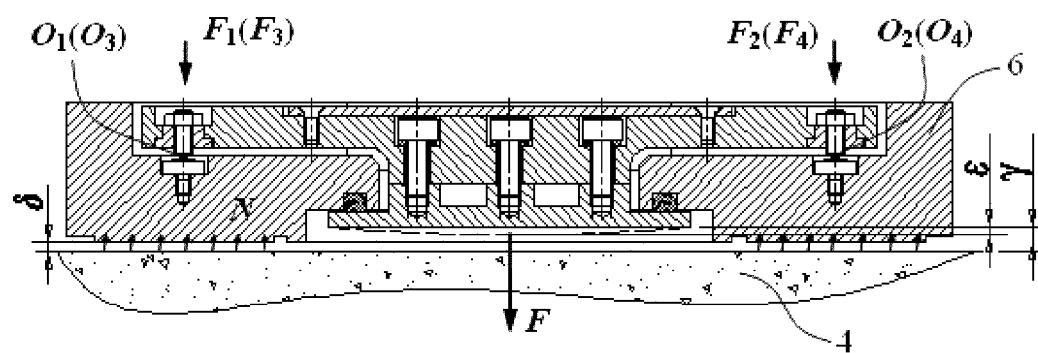
FIG. 7 illustrates the operating mechanism of the aerostatic bearing embodying the present invention.

Moreover, the four support adjusting screws 8 may be disposed at locations respectively on same normal lines of the platform 4 (as shown in FIG. 7) with centers $O_1, O_2, O_3, O_4$ of the corresponding air floating elements 2'a, 2'b, 2'c, 2'd.

With continuing reference to FIG. 5, the support adjusting screws 8 are configured to adjust the distance between the vacuum plate fixing frame 9 and the aerostatic bearing plate 6.

For instance, adjusting the support adjusting screws 8 can enable the vacuum plate fixing frame 9 to move upwards relative to the aerostatic bearing plate 6 (i.e., enables the distance between the vacuum plate fixing frame 9 and the aerostatic bearing plate 6 to be increased). The movement of the vacuum plate fixing frame 9 can also drive the vacuum plate 12 to move upwards to make the vacuum plate 12 squeeze the rubber sealing ring 11 more tightly, thereby providing the vacuum chamber 13 with a better sealing effect.

With further reference to FIG. 3, the vacuum plate fixing frame 9 may be positioned by three flexible reeds 5a, 5b, 5c in the horizontal direction to limit the horizontal translation and rotation freedom of the vacuum pre-tightening structure 7 in the horizontal plane.

The vacuum plate fixing frame 9 may assume an approximately rectangular shape and the three flexible reeds 5a, 5b, 5c are disposed on respective three edges of the vacuum plate fixing frame 9.

Figure 6:
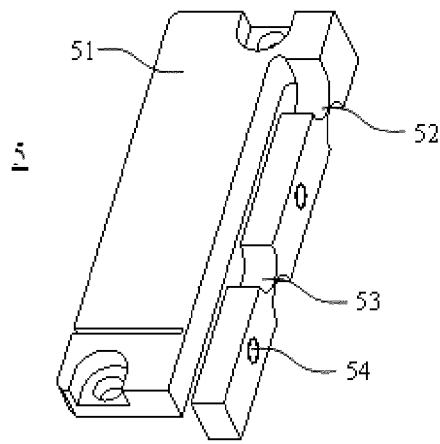
FIG. 6 schematically illustrates a flexible reed of the aerostatic bearing embodying the present invention.

The three flexible reeds 5a, 5b, 5c may have the same structure, and any of them can be represented by the numeral 5 in FIG. 6. The flexible reed 5 may include a body 51, a first vertical reed 52 and a second vertical reed 53.

The first vertical reed 52 and the second vertical reed 53 may be arranged on a same side of the body 51 and the first vertical reed has one end coupled to the body 51 and the other end coupled to one end of the second vertical reed 53.

Moreover, the body 51 may be coupled to the aerostatic bearing plate 6 and both of the first and second vertical reeds 52, 53 are coupled to the vacuum plate fixing frame 9.

As shown in FIGS. 5 and 6, the body 51 may be fixed (vertically) on the aerostatic bearing plate 6 by screws and the first and second vertical reeds 52, 53 include a mounting hole 54 respectively configured to allow them to be coupled (horizontally) to the vacuum plate fixing frame 9.

The flexible reeds may have a high horizontal stiffness in order to prevent relative motions between the air floating elements and the vacuum pre-tightening structure when the aerostatic bearing is moving with the precision moving table. Meanwhile, the flexible reeds may have a low vertical stiffness so as to ensure the adjustability of the distance between the vacuum plate fixing frame 9 and the aerostatic bearing plate 6 by the support adjusting screws 8.

The operating mechanism of the split-type aerostatic bearing of the present invention will be described below with reference to FIG. 7.

When the split-type aerostatic bearing is operating, the aerostatic bearing plate 6 are supported by the aerostatic forces N generated by the four air floating elements $2'a$, $2'b$, $2'c$, $2'd$ (i.e., each of the air floating elements applies an aerostatic forces N to the aerostatic bearing plate 6). Of each aerostatic force N, the application point is at the center of a corresponding air floating element and the application direction is upwards, perpendicular to the platform 4. When negative pressure gas is introduced into the vacuum chamber 13, it will generate a vacuum pre-tightening force F operated on the vacuum pre-tightening structure 7. The vacuum pre-tightening force F will thereafter cause the vacuum pre-tightening structure 7 to generate a force on the aerostatic bearing plate 6. As the vacuum pre-tightening structure 7 is coupled to the aerostatic bearing plate 6 by the four support adjusting screws 8, the force operated on the aerostatic bearing plate 6 can be resolved to four components $F_1$, $F_2$, $F_3$, $F_4$. In light of the discussion above, application points of the four components F1, F2, F3, F4 are respectively on same normal lines of the platform 4 with centers $O_1$, $O_2$, $O_3$, $O_4$ of the corresponding air floating elements $2'a$, $2'b$, $2'c$, $2'd$. Moreover, their application directions are all downwards, perpendicular to the platform 4 and there exists the relation, $F=F_1+F_2+F_3+F_4$. Therefore, as indicated in FIG. 7, each aerostatic force N is equal in magnitude to, opposite in direction to, and has the application point located on a same normal line of the platform 4 with, a corresponding one of the components F1, F2, F3, F4. Thus, the aerostatic bearing plate 6 will not be bent out of shape.

Moreover, vertical flexibility of the flexible reeds $5a$, $5b$, $5c$ can ensure application points of the four components $F_1$, $F_2$, $F_3$, $F_4$ to be located on same normal lines of the platform 4 with centers $O_1$, $O_2$, $O_3$, $O_4$ of the corresponding air floating elements $2'a$, $2'b$, $2'c$, $2'd$.

While bending may occur at a portion of the vacuum plate 12 under the vacuum pre-tightening force F (as shown by the dotted line in FIG. 7), as long as the amount of the bending $\epsilon$ is smaller than the distance $\gamma$ between the vacuum plate 12 and the platform 4 (before the vacuum plate 12 was bent), the bending of the vacuum plate 12 will not affect the movement of the aerostatic bearing at all. As indicated above, with the present invention, the value of the distance $\gamma$ can be controlled within an appropriate range by a proper structure design of the aerostatic bearing.

Conclusively, in the split-type aerostatic bearing of the present invention, the separation of the air floating elements from the vacuum pre-tightening structure and the alignment of the application points of the vacuum pre-tightening force with the corresponding centers of the air floating elements prevents the plate from bending out of shape and hence ensures the normal operation of the aerostatic bearing when to seek for a higher aerostatic stiffness by increasing the vacuum pre-tightening force.

Therefore, the split-type aerostatic bearing of the present invention meets the demand for a high aerostatic stiffness.

What is claimed is:

1. An aerostatic bearing for supporting a moving table to move substantially frictionlessly on a platform, the aerostatic bearing comprising:
    an aerostatic bearing plate;
    air floating elements disposed on a bottom of the aerostatic bearing plate;
    a vacuum pre-tightening structure disposed on the aerostatic bearing plate, wherein the vacuum pre-tightening structure is detachably coupled to the aerostatic bearing plate, each coupling point between the vacuum pre-tightening structure and the aerostatic bearing plate is aligned on a same normal line of the platform with a center of a corresponding one of the air floating elements.

2. The aerostatic bearing according to claim 1, wherein a bottom surface of the vacuum pre-tightening structure is at a higher level than a bottom surface of the aerostatic bearing plate.

3. The aerostatic bearing according to claim 1, wherein the vacuum pre-tightening structure includes a vacuum plate and a vacuum plate fixing frame,
    wherein the vacuum plate is disposed on a bottom of the vacuum plate fixing frame,
    wherein the vacuum plate fixing frame is coupled to the aerostatic bearing plate, and
    wherein a vacuum chamber is formed between the vacuum plate and the aerostatic bearing plate.

4. The aerostatic bearing according to claim 3, wherein a sealing ring for sealing the vacuum chamber is disposed between the vacuum plate and the aerostatic bearing plate.

5. The aerostatic bearing according to claim 4, wherein the vacuum plate fixing frame is coupled to the aerostatic bearing plate by support adjusting screws which adjust a distance between the vacuum plate and the aerostatic bearing plate and thereby drive the vacuum plate to squeeze the sealing ring.

6. The aerostatic bearing according to claim 3, wherein the vacuum pre-tightening structure further includes a capping plate disposed on a top of the vacuum plate fixing frame.

7. The aerostatic bearing according to claim 1, wherein flexible reeds for horizontally positioning the vacuum pre-tightening structure are disposed at edges of the vacuum pre-tightening structure.

8. The aerostatic bearing according to claim 7, wherein each of the flexible reeds includes a body, a first vertical reed and a second vertical reed,
    wherein the first vertical reed and the second vertical reed are arranged on a same side of the body, the first vertical reed having one end coupled to the body and the other end coupled to one end of the second vertical reed, and
    wherein the body is coupled to the aerostatic bearing plate, and both the first vertical reed and the second vertical reed are coupled to the vacuum pre-tightening structure.

9. The aerostatic bearing according to claim 1, wherein each of the air floating elements is disposed at a corresponding one of four corners of the bottom of the aerostatic bearing plate.

10. The aerostatic bearing according to claim 9, wherein all four corners of the vacuum pre-tightening structure are coupled to the aerostatic bearing plate, and wherein a coupling point between each corner and the aerostatic bearing plate is aligned on a same normal line of the platform with a center of a corresponding one of the air floating elements.

\* \* \* \* \*